United States Patent
Ebihara et al.

(10) Patent No.: US 9,209,775 B2
(45) Date of Patent: Dec. 8, 2015

(54) ELECTRONIC CIRCUIT

(71) Applicant: TAIYO YUDEN CO., LTD., Tokyo (JP)

(72) Inventors: Hitoshi Ebihara, Tokyo (JP); Hiroshi Hara, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 0 days.

(21) Appl. No.: 14/463,445

(22) Filed: Aug. 19, 2014

(65) Prior Publication Data
US 2015/0077194 A1  Mar. 19, 2015

(30) Foreign Application Priority Data

Sep. 18, 2013  (JP) .................................. 2013-193460

(51) Int. Cl.
| | |
|---|---|
| H01P 1/10 | (2006.01) |
| H03H 7/46 | (2006.01) |
| H03H 9/70 | (2006.01) |
| H03H 11/34 | (2006.01) |
| H04M 1/00 | (2006.01) |
| H04B 1/44 | (2006.01) |
| H04B 1/56 | (2006.01) |
| H04L 5/14 | (2006.01) |

(52) U.S. Cl.
CPC ................. *H03H 7/465* (2013.01); *H03H 9/70* (2013.01); *H03H 11/344* (2013.01)

(58) Field of Classification Search
CPC .............. H01P 1/10; H04B 1/48; H04B 1/50; H04L 5/14
USPC .................... 333/101, 103; 455/78, 83, 552.1; 370/276, 278
See application file for complete search history.

(56) References Cited

U.S. PATENT DOCUMENTS

| | | | | |
|---|---|---|---|---|
| 7,596,357 | B2* | 9/2009 | Nakamata | H04B 1/006 455/78 |
| 7,676,244 | B2* | 3/2010 | Park | H04B 1/006 370/276 |
| 8,368,484 | B2* | 2/2013 | Uejima | H03H 7/463 333/101 |
| 8,660,603 | B2* | 2/2014 | Block | H04B 1/006 370/276 |
| 8,803,632 | B2* | 8/2014 | Takeuchi | H03H 7/38 333/101 |
| 8,891,412 | B2* | 11/2014 | Tikka | H04B 1/0057 370/278 |
| 8,976,707 | B2* | 3/2015 | Aramata | H04L 5/14 370/254 |
| 9,001,710 | B2* | 4/2015 | Uejima | H04B 1/44 370/282 |
| 9,077,439 | B2* | 7/2015 | Uejima | H04B 1/0057 |
| 2013/0051287 | A1 | 2/2013 | Aramata et al. | |
| 2014/0073268 | A1* | 3/2014 | Taniuchi | H01P 1/10 455/83 |
| 2014/0097999 | A1* | 4/2014 | Murase | H04B 1/0057 343/860 |

FOREIGN PATENT DOCUMENTS

JP    2013-46078 A    3/2013
* cited by examiner

*Primary Examiner* — Dean Takaoka
(74) *Attorney, Agent, or Firm* — Chen Yoshimura LLP

(57) ABSTRACT

An electronic circuit includes: a switch that includes ports, and selects a port to be connected to an antenna from among the ports; a first filter connected between a first port and a first terminal, and having a pass band which overlaps with a transmission band of a first band; a second filter connected between a second port and a second terminal, and having a pass band which overlaps with a transmission band of a second band; a third filter connected between a third port and a third terminal, and having a pass band which overlaps with reception bands of the first and the second bands; wherein when a signal in the first band is transmitted and received, the switch selects the first and the third ports, and when a signal in the second band is transmitted and received, the switch selects the second and the third ports.

12 Claims, 8 Drawing Sheets

ELECTRONIC CIRCUIT

CROSS-REFERENCE TO RELATED APPLICATION

This application is based upon and claims the benefit of priority of the prior Japanese Patent Application No. 2013-193460, filed on Sep. 18, 2013, the entire contents of which are incorporated herein by reference.

FIELD

A certain aspect of the present invention relates to an electronic circuit.

BACKGROUND

A communication apparatus, such as a mobile phone, can be used in a plurality of frequency bands. Therefore, it is required that a module mounted in the communication apparatus deals with the plurality of frequency bands (see e.g. Japanese Patent Application Publication No. 2013-46078).

By connecting a plurality of duplexers into the communication apparatus, the plurality of frequency bands can be used. However, an electronic circuit including the plurality of duplexers is enlarged.

SUMMARY OF THE INVENTION

According to an aspect of the present invention, there is provided an electronic circuit including: a switch that includes a plurality of ports, and selects a port to be connected to an antenna from among the plurality of ports; a first filter that is connected between a first port in the plurality of ports and a first terminal, and has a pass band which overlaps with a transmission band of a first band; a second filter that is connected between a second port in the plurality of ports and a second terminal, and has a pass band which overlaps with a transmission band of a second band; a third filter that is connected between a third port in the plurality of ports and a third terminal, and has a pass band which overlaps with a reception band of the first band and a reception band of the second band; wherein when a signal in the first band is transmitted and received, the switch selects the first port and the third port, and when a signal in the second band is transmitted and received, the switch selects the second port and the third port.

DETAILED DESCRIPTION

A description will be given of embodiments with reference to the drawings.

First Embodiment

Figure 1:
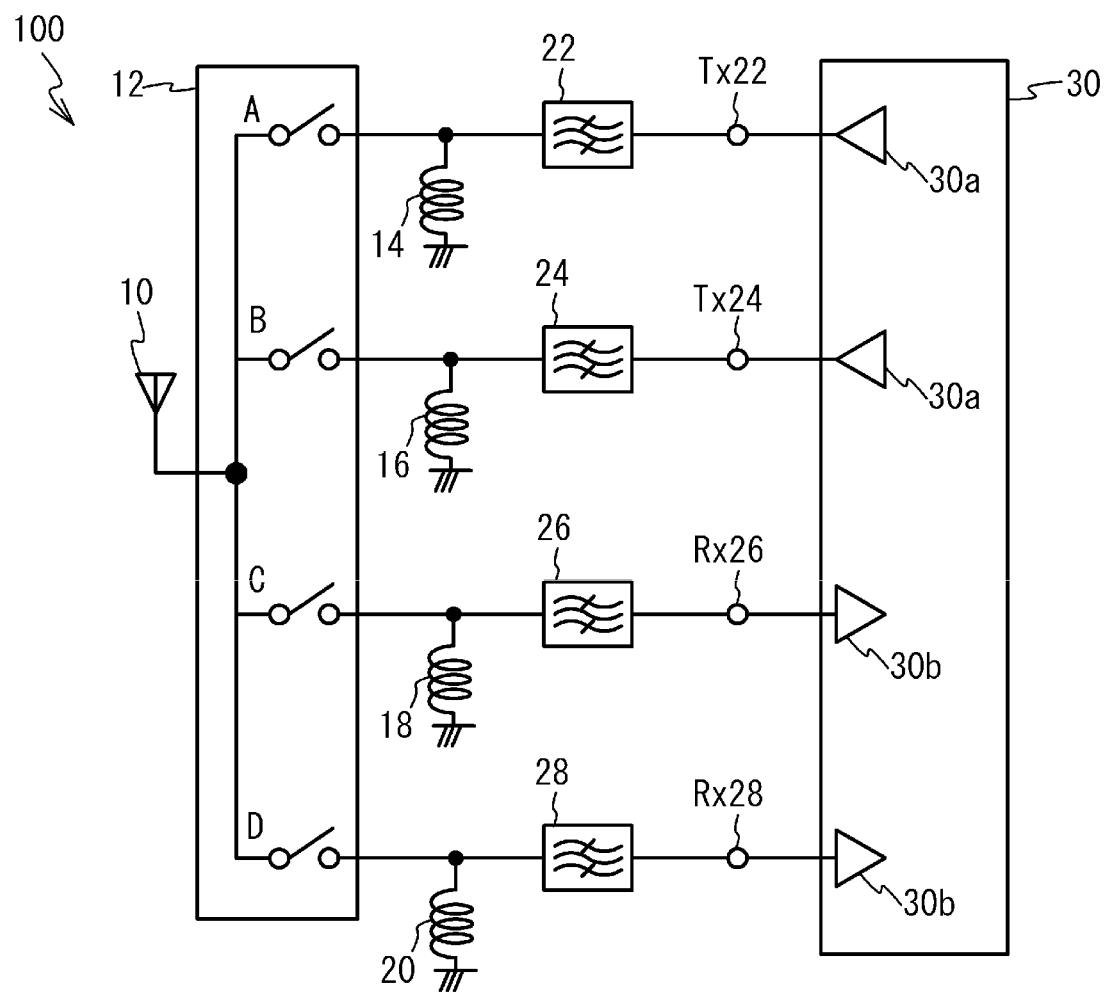
FIG. 1 is a block diagram illustrating an electronic circuit according to a first embodiment.

A first embodiment is an example in which signals having three frequency bands are transmitted and received using four filters. FIG. 1 is a block diagram illustrating an electronic circuit 100 according to the first embodiment.

As illustrated in FIG. 1, the electronic circuit 100 includes a switch 12, inductors 14, 16, 18 and 20, filters 22, 24, 26 and 28, and an integrated circuit (IC) 30. For example, the electronic circuit 100 is used for a front end module for a communication apparatus, or the like. An antenna 10 transmits and receives a high-frequency signal.

The switch 12 is a semiconductor switch including four ports A to D. The filter 22 is connected between the port A and the transmission terminal Tx22. The filter 24 is connected between the port B and the transmission terminal Tx24. The filter 26 is connected between the port C and the reception terminal Rx26. The filter 28 is connected between the port D and the reception terminal Rx28. Each filter is a band pass filter, such as a surface acoustic wave (SAW) filter, for example.

An end of the inductor 14 is connected between the port A and the filter 22. An end of the inductor 16 is connected between the port B and the filter 24. An end of the inductor 18 is connected between the port C and the filter 26. An end of the inductor 20 is connected between the port D and the filter 28. Another end of each of the inductors is grounded. Each inductor performs the impedance matching between the antenna 10 and each filter.

The IC 30 performs signal processing, such as up conversion and down conversion. The IC 30 includes a plurality of power amplifiers (PA) 30a and a plurality of low noise amplifiers (LNA) 30b. Each PA 30a amplifies a transmission signal. Each LNA 30b amplifies a reception signal. The electronic circuit 100 corresponds to W-CDMA (Wideband Code Division Multiple Access) Band1, Band3 and Band4.

Figure 2:
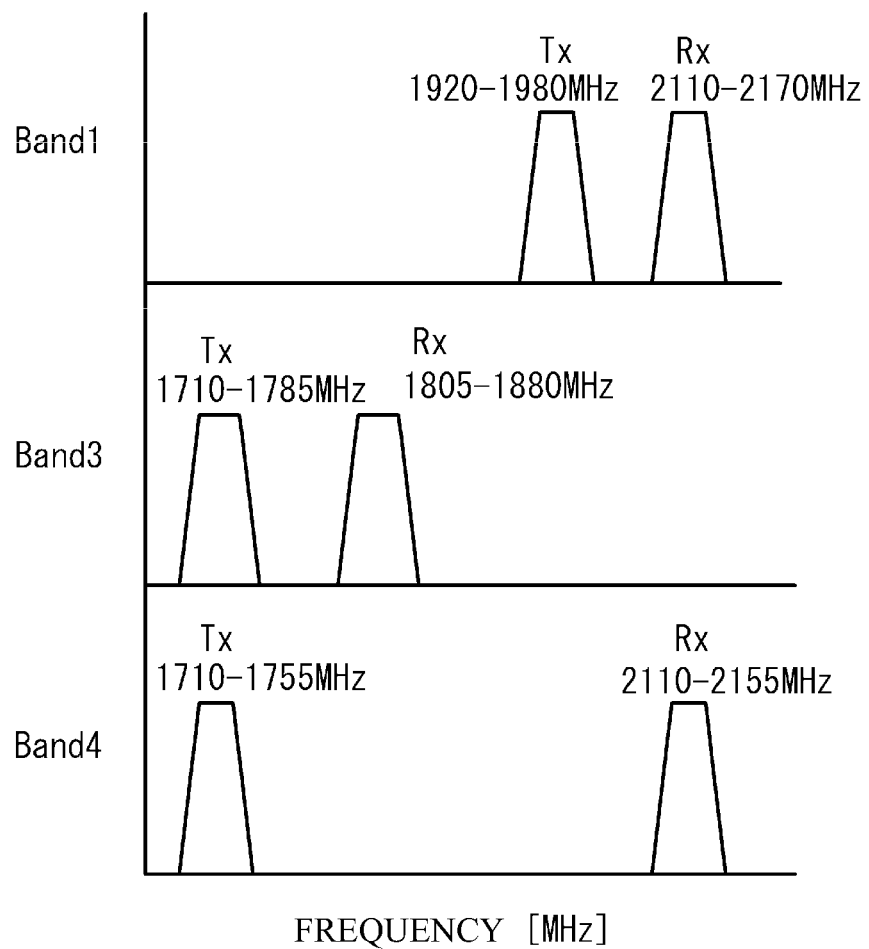
FIG. 2 is a schematic diagram illustrating frequency bands of each band.

FIG. 2 is a schematic diagram illustrating frequency bands of each band, and indicates the Band1, the Band3 and the Band4 sequentially from above. A horizontal axis of FIG. 2 indicates a frequency. As illustrated in FIG. 2, a transmission band (Tx) of the Band3 overlaps with the transmission band of the Band4. A reception band (Rx) of the Band1 overlaps with the reception band of the Band4.

The filter 22 is a transmit filter, and the pass band of the filter 22 overlaps with the transmission band of the Band1. The filter 24 is a transmit filter, and the pass band of the filter 24 overlaps with the transmission band of the Band3 and the transmission band of the Band4. The filter 26 is a receive filter, and the pass band of the filter 26 overlaps with the reception band of the Band1 and the reception band of the Band4. The filter 28 is a receive filter, and the pass band of the filter 28 overlaps with the reception band of the Band3.

A description will be given of the transmission and the reception of signals. The switch 12 selects a port from the ports A to D according to a frequency band to be used, and connects the selected port to the antenna 10. A table 1 illustrates a relationship between the frequency bands and the ports according to the first embodiment.

TABLE 1

| No. | FREQUENCY BAND | PORT A | B | C | D |
|---|---|---|---|---|---|
| 1 | Band1 | ON | OFF | ON | OFF |
| 2 | Band3 | OFF | ON | OFF | ON |
| 3 | Band4 | OFF | ON | ON | OFF |

Figure 3:
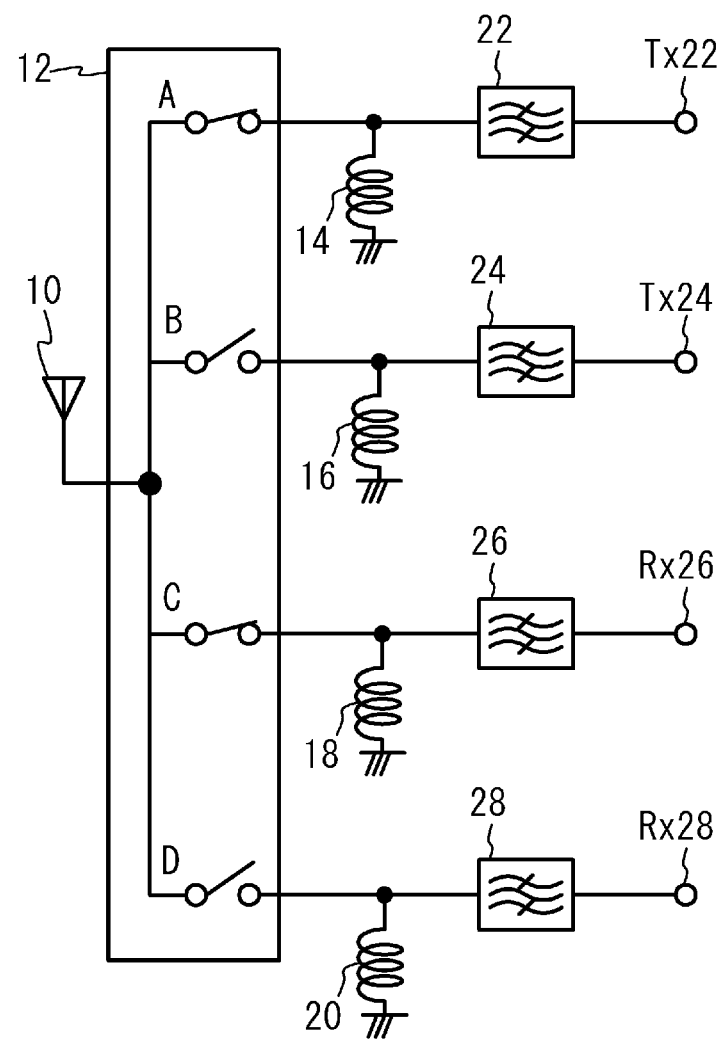
FIG. 3 is a block diagram illustrating an example of NO. 1 in a table 1.

FIG. 3 is a block diagram illustrating an example of NO. 1 in the table 1. When the communication of the NO. 1 (Band1) is performed, the switch 12 turns on the ports A and C, and turns off the other ports (i.e., the ports B and D), as illustrated in FIG. 3 and the table 1. A transmission signal having a frequency of the transmission band of the Band1 is inputted from the transmission terminal Tx22 to the filter 22. The transmission signal is filtered with the filter 22, and is transmitted from the antenna 10 via the switch 12. A reception signal having a frequency of the reception band of the Band1 is received from the antenna 10, and is inputted to the filter 26 via the switch 12. The reception signal filtered with the filter 26 is inputted to the IC 30 through the reception terminal Rx26. Since the ports B and D are turned off, the transmission signal and the reception signal are not inputted to the filters 24 and 28.

Figure 4:
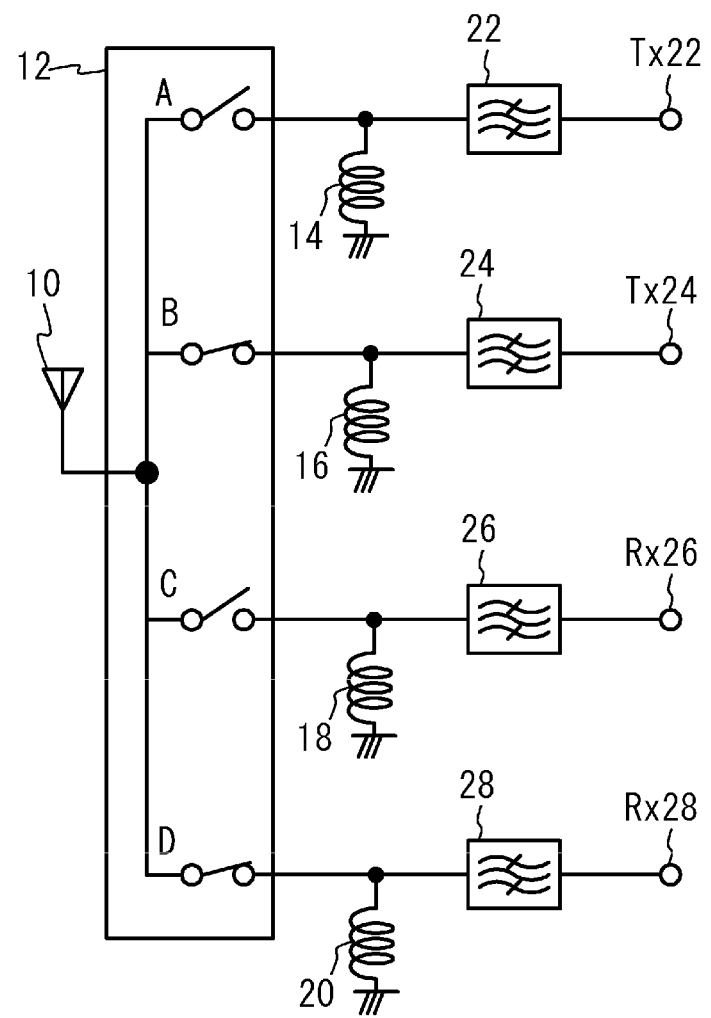
FIG. 4 is a block diagram illustrating an example of NO. 2 in the table 1.
Figure 5:
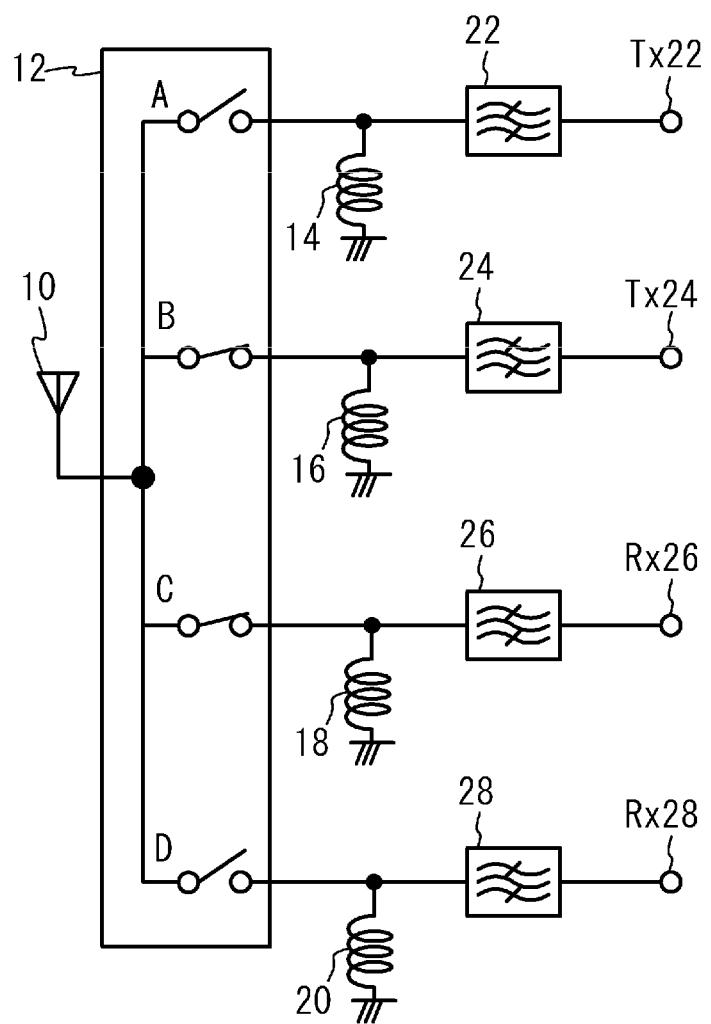
FIG. 5 is a block diagram illustrating an example of NO. 3 in the table 1.

FIG. 4 is a block diagram illustrating an example of NO. 2 in the table 1. When the communication of the NO. 2 (Band3) is performed, the switch 12 turns on the ports B and D, and turns off the other ports (e.g. the ports A and C), as illustrated in FIG. 4 and the table 1. The transmission signal is transmitted from the antenna 10 via the filter 24. The reception signal is inputted to the IC 30 via the filter 28. FIG. 5 is a block diagram illustrating an example of NO. 3 in the table 1. When the communication of the NO. 3 (Band4) is performed, the switch 12 turns on the ports B and C, and turns off the other ports (e.g. the ports A and D). The transmission signal is transmitted from the antenna 10 via the filter 24. The reception signal is inputted to the IC 30 via the filter 26.

According to the first embodiment, the communication of three Band(s) is performed using four filters. Therefore, the electronic circuit 100 can be downsized. That is, the front end module using the electronic circuit 100 also can be downsized.

Figure 6:
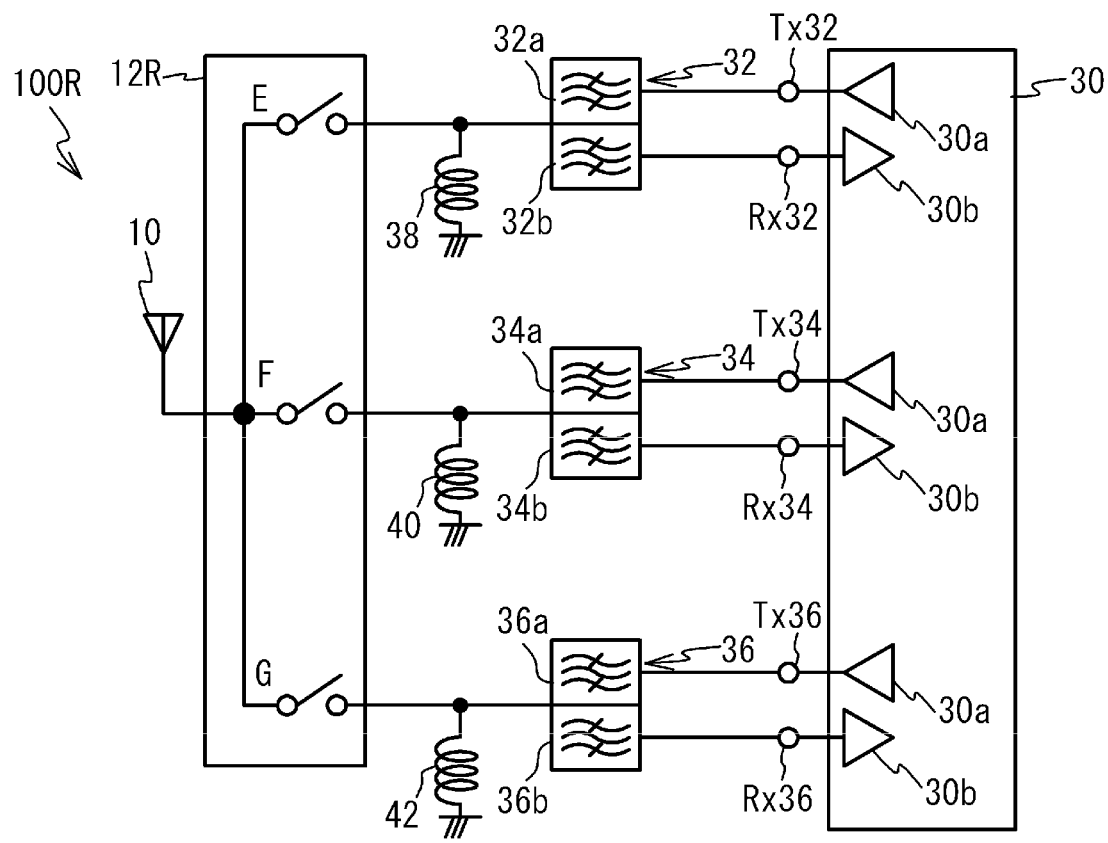
FIG. 6 is a block diagram illustrating an electronic circuit according to a comparative example.

A description will be given of a comparative example. FIG. 6 is a block diagram illustrating an electronic circuit 100R according to the comparative example. As illustrated in FIG. 6, a switch 12R of the electronic circuit 100R includes three ports E to G. A duplexer 32 is connected to the port E. A duplexer 34 is connected to the port F. A duplexer 36 is connected to the port G.

An inductor 38 is connected between the port E and the duplexer 32. An inductor 40 is connected between the port F and the duplexer 34. An inductor 42 is connected between the port G and the duplexer 36.

The duplexer 32 includes a transmit filter 32a and a receive filter 32b. The transmit filter 32a is connected to a transmission terminal Tx32, and the receive filter 32b is connected to a reception terminal Rx32. The duplexer 34 includes a transmit filter 34a and a receive filter 34b. The transmit filter 34a is connected to a transmission terminal Tx34, and the receive filter 34b is connected to a reception terminal Rx34. The duplexer 36 includes a transmit filter 36a and a receive filter 36b. The transmit filter 36a is connected to a transmission terminal Tx36, and the receive filter 36b is connected to a reception terminal Rx36.

The duplexer 32 corresponds to the Band1. The duplexer 34 corresponds to the Band3. The duplexer 36 corresponds to the Band4. The switch 12R selects one port according to the frequency band, and connects the selected port to the antenna 10. In the comparative example, the communication of three Bands is performed using three duplexers, i.e., six filters. Since there are many filters, the electronic circuit 100R becomes large. According to the first embodiment, the communication of the three Band(s) can be performed using the four filters. Therefore, the electronic circuit is downsized.

As described above, the inductors 14, 16, 18 and 20 illustrated in FIG. 1 perform impedance matching between the antenna 10 and the respective filters. Each of the inductors 14, 16, 18 and 20 performs the impedance matching so that an impedance seen from the antenna 10 in the pass band of each filter becomes the same as an impedance (e.g. 50Ω) of an antenna line. The antenna line is a wiring that connects the antenna 10 and the switch 12. A table 2 illustrates an example of inductances of the inductors in the electronic circuit 100.

TABLE 2

| | INDUCTOR | | | |
|---|---|---|---|---|
| | 14 | 16 | 18 | 20 |
| INDUCTANCE [nH] | 5.4 | 8.5 | 5.4 | 7.2 |

The inductances may be values other than the values in the table 2. When the inductances are large, Q-values of the inductors become high and the losses of the signals become small. When the inductances are small, Q-values of the inductors become low and the losses of the signals become large.

Figure 7:
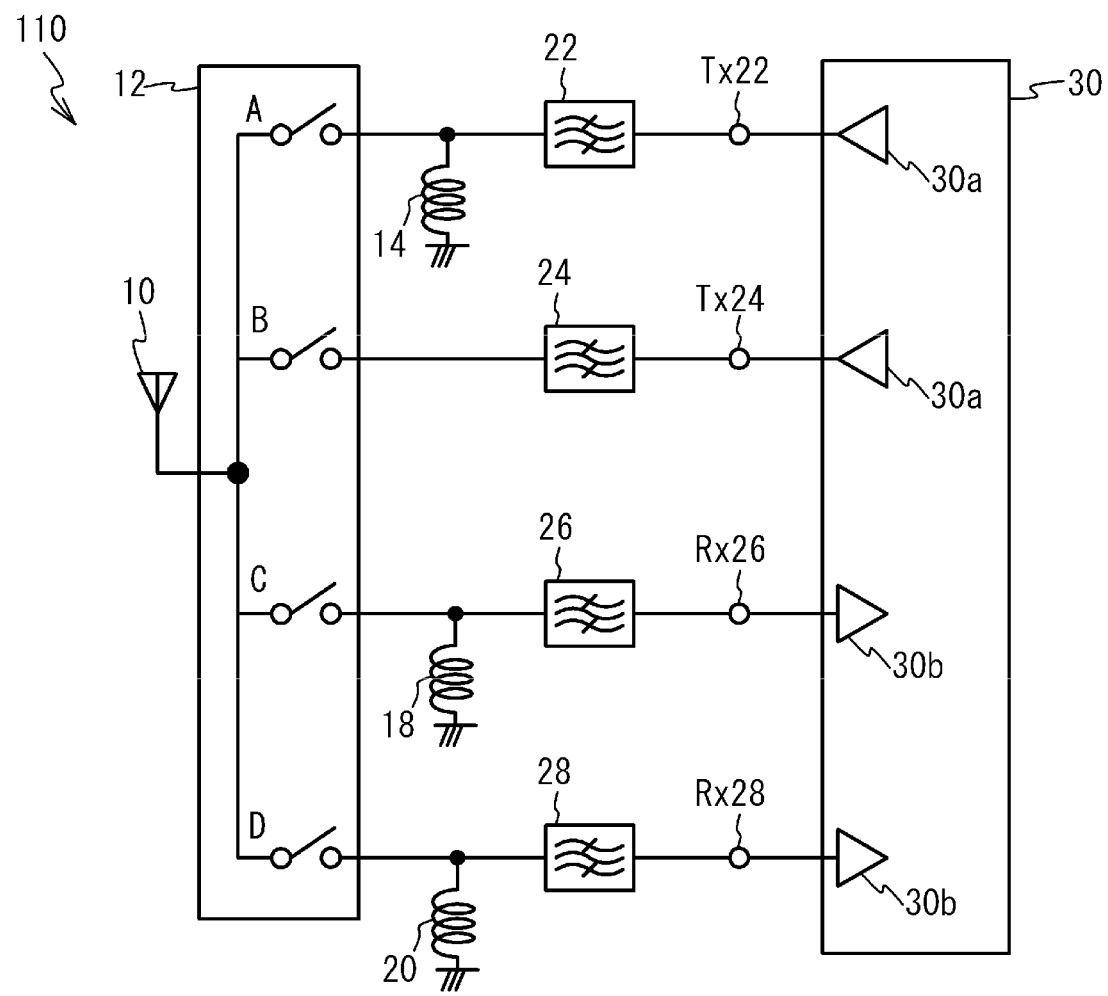
FIG. 7 is a block diagram illustrating an electronic circuit according to a variation example of the first embodiment.

FIG. 7 is a block diagram illustrating an electronic circuit 110 according to a variation example of the first embodiment. As illustrated in FIG. 7, the inductor 16 is not provided. Since the number of inductors is less than that of inductors in the example of FIG. 1, the electronic circuit 110 can be downsized.

A table 3 illustrates an example of inductances of the inductors in the electronic circuit 110.

TABLE 3

| | INDUCTOR | | |
|---|---|---|---|
| | 14 | 18 | 20 |
| INDUCTANCE [nH] | 14.9 | 3.3 | 3.9 |

With respect to a combined inductance seen from the antenna 10 in each example of FIGS. 3 to 5, the example of the table 2 is approximately equal to the example of the table 3. Therefore, the impedance matching can be performed with the inductances illustrated in FIG. 3.

When the number of inductors becomes three as illustrated in the table 3, the inductances of the inductors 18 and 20 become smaller than those of the inductors 18 and 20 in the table 2. When the inductances become small, the Q-values reduce and hence the losses of the signals become large. In order to increase the inductances and to control the losses of the signal, it is desirable to connect at least three inductors to the four ports. That is, the inductors are connected to at least three of a line between the port A and the filter 22, a line between the port B and the filter 24, a line between the port C and the filter 26 and a line between the port D and the filter 28. The inductors are connected to the four ports, respectively, as illustrated in FIG. 1, so that the losses of the signals become smaller.

A matching circuit other than the inductors may be provided. However, it is desirable that the matching circuit includes an inductor. In the frequencies outside the pass band, each of the filters functions as a capacitor. By connecting the inductors, the capacitive components of the filters can be negated and the impedance matching can be secured.

Second Embodiment

Figure 8A:
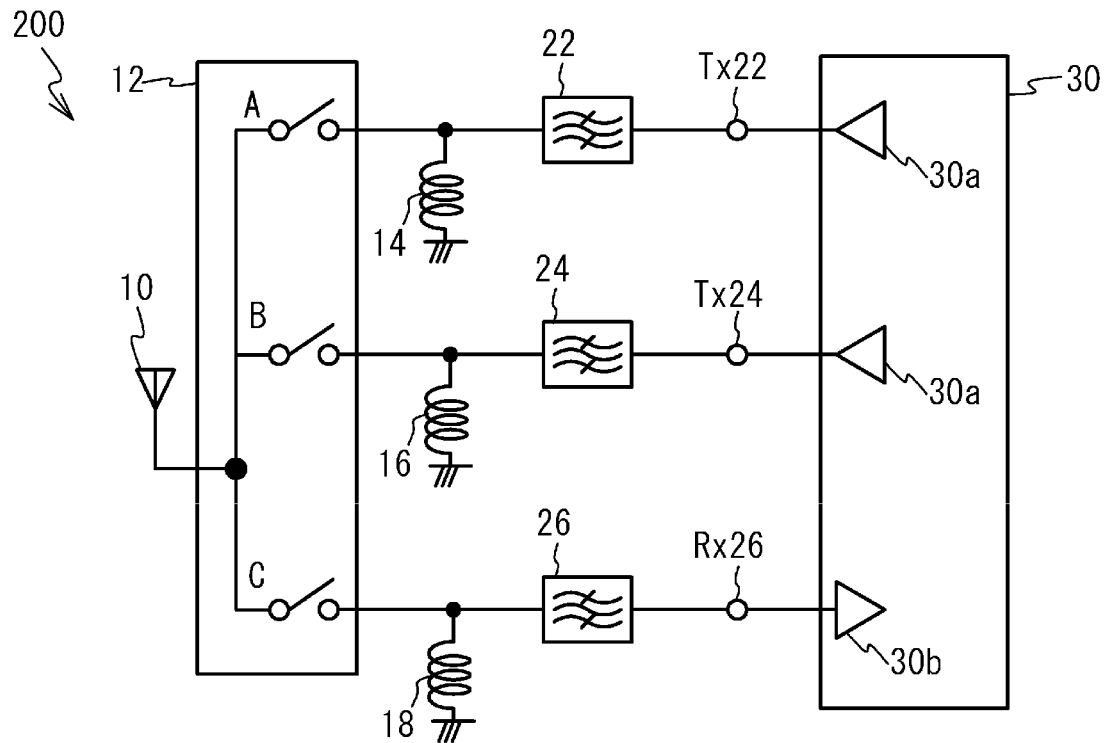
FIG. 8A is a block diagram illustrating an electronic circuit according to a second embodiment.

A second embodiment is an example in which the communication of two Bands is performed with three filters. FIG. 8A is a block diagram illustrating an electronic circuit 200 according to the second embodiment. As illustrated in FIG. 8A, the electronic circuit 200 includes the filters 22, 24 and 26. The switch 12 includes the ports A to C. A table 4 illustrates a relationship between the frequency bands and the ports according to the second embodiment.

TABLE 4

| FREQUENCY | | PORT | | |
|---|---|---|---|---|
| No | BAND | A | B | C |
| 4 | Band1 | ON | OFF | ON |
| 5 | Band4 | OFF | ON | ON |

As illustrated in the table 4, the electronic circuit 200 can perform the communication using the Band1 and the Band4.

Third Embodiment

Figure 8B:
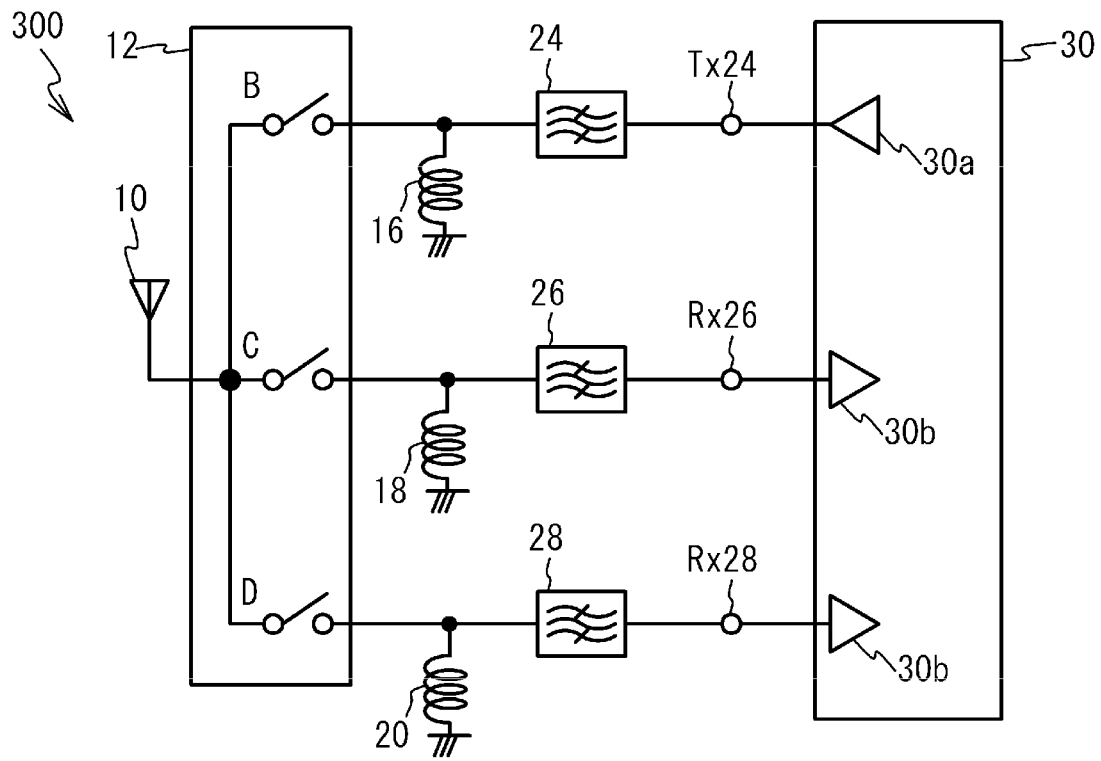
FIG. 8B is a block diagram illustrating an electronic circuit according to a third embodiment.

FIG. 8B is a block diagram illustrating an electronic circuit 300 according to a third embodiment. As illustrated in FIG. 8B, the electronic circuit 300 includes the filters 24, 26 and 28. The switch 12 includes the ports B to D. A table 5 illustrates a relationship between the frequency bands and the ports according to the third embodiment.

TABLE 5

| FREQUENCY | | PORT | | |
|---|---|---|---|---|
| No | BAND | B | C | D |
| 6 | Band3 | ON | OFF | ON |
| 7 | Band4 | ON | ON | OFF |

As illustrated in the table 5, the electronic circuit 300 can perform the communication using the Band3 and the Band4.

The number of filters, the number of inductors and the number of ports can be changed according to the number of frequency bands. The frequency band is not limited to the W-CDMA, the Band1, the Band3 and the Band4. The transmission bands in the plurality of frequency bands overlap with each other, or the reception bands in the plurality of frequency bands overlap with each other, so that the filter can be used in common with the plurality of Band(s). The filter may be an acoustic wave filter such as an acoustic boundary wave filter and a filter using a film bulk acoustic resonator (FBAR), or may be a filter other than the acoustic wave filter.

Although the embodiments of the present invention have been described in detail, it is to be understood that the various change, substitutions, and alterations could be made hereto without departing from the spirit and scope of the invention.

What is claimed is:

1. An electronic circuit comprising:
   a switch that includes a plurality of ports, and selects a port to be connected to an antenna from among the plurality of ports;
   a first filter that is connected between a first port in the plurality of ports and a first terminal, and has a pass band which overlaps with a transmission band of a first band;
   a second filter that is connected between a second port in the plurality of ports and a second terminal, and has a pass band which overlaps with a transmission band of a second band;
   a third filter that is connected between a third port in the plurality of ports and a third terminal, and has a pass band which overlaps with a reception band of the first band and a reception band of the second band;
   wherein when a signal in the first band is transmitted and received, the switch selects the first port and the third port, and
   when a signal in the second band is transmitted and received, the switch selects the second port and the third port.

2. The electronic circuit according to claim 1, further comprising:
   a fourth filter that is connected between a fourth port in the plurality of ports and a fourth terminal, and has a pass band which overlaps with a reception band of a third band;
   wherein the pass band of the second filter overlaps with the transmission band of the second band and a transmission band of the third band, and
   when a signal in the third band is transmitted and received, the switch selects the second port and the fourth port.

3. The electronic circuit according to claim 2, further comprising:
   a plurality of matching circuits that are connected to at least three of a line between the first port and the first filter, a line between the second port and the second filter, a line between the third port and the third filter, and a line between the fourth port and the fourth filter.

4. The electronic circuit according to claim 3, wherein
   the plurality of matching circuits are connected to the line between the first port and the first filter, the line between the second port and the second filter, the line between the third port and the third filter, and the line between the fourth port and the fourth filter, respectively.

5. The electronic circuit according to claim 3, wherein
   the plurality of matching circuits are connected to three of the line between the first port and the first filter, the line between the second port and the second filter, the line between the third port and the third filter, and the line between the fourth port and the fourth filter.

6. The electronic circuit according to claim 3, wherein
   each of the matching circuits is an inductor.

7. An electronic circuit comprising:
   a switch that includes a plurality of ports, and selects a port to be connected to an antenna from among the plurality of ports;
   a first filter that is connected between a first port in the plurality of ports and a first terminal, and has a pass band which overlaps with a reception band of a first band;
   a second filter that is connected between a second port in the plurality of ports and a second terminal, and has a pass band which overlaps with a reception band of a second band;
   a third filter that is connected between a third port in the plurality of ports and a third terminal, and has a pass band which overlaps with a transmission band of the first band and a transmission band of the second band;
   wherein when a signal in the first band is transmitted and received, the switch selects the first port and the third port, and when a signal in the second band is transmitted and received, the switch selects the second port and the third port.

8. The electronic circuit according to claim 7, further comprising:
a fourth filter that is connected between a fourth port in the plurality of ports and a fourth terminal, and has a pass band which overlaps with a transmission band of a third band;
wherein the pass band of the second filter overlaps with the reception band of the second band and a reception band of the third band, and
when a signal in the third band is transmitted and received, the switch selects the second port and the fourth port.

9. The electronic circuit according to claim 8, further comprising:
a plurality of matching circuits that are connected to at least three of a line between the first port and the first filter, a line between the second port and the second filter, a line between the third port and the third filter, and a line between the fourth port and the fourth filter.

10. The electronic circuit according to claim 9, wherein the plurality of matching circuits are connected to the line between the first port and the first filter, the line between the second port and the second filter, the line between the third port and the third filter, and the line between the fourth port and the fourth filter, respectively.

11. The electronic circuit according to claim 9, wherein the plurality of matching circuits are connected to three of the line between the first port and the first filter, the line between the second port and the second filter, the line between the third port and the third filter, and the line between the fourth port and the fourth filter.

12. The electronic circuit according to claim 9, wherein each of the matching circuits is an inductor.

\* \* \* \* \*